(12) United States Patent
Reddy (10) Patent No.: US 9,977,615 B2
(45) Date of Patent: May 22, 2018

(54) SMART REFRESH OF DATA ON FLASH DEVICES

(71) Applicant: Qualcomm Innovation Center, Inc., San Diego, CA (US)

(72) Inventor: Nikhilesh Reddy, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 133 days.

(21) Appl. No.: 15/265,400

(22) Filed: Sep. 14, 2016

(65) Prior Publication Data

US 2017/0090792 A1   Mar. 30, 2017

Related U.S. Application Data

(60) Provisional application No. 62/233,731, filed on Sep. 28, 2015.

(51) Int. Cl.
*G06F 12/00* (2006.01)
*G06F 3/06* (2006.01)
*G11C 16/34* (2006.01)

(52) U.S. Cl.
CPC .......... *G06F 3/0619* (2013.01); *G06F 3/064* (2013.01); *G06F 3/065* (2013.01); *G06F 3/0652* (2013.01); *G06F 3/0679* (2013.01); *G11C 16/3431* (2013.01)

(58) Field of Classification Search
None
See application file for complete search history.

(56) References Cited

U.S. PATENT DOCUMENTS

| | | | | |
|---|---|---|---|---|
| 2009/0172267 A1* | 7/2009 | Oribe | ................ | G11C 16/3418 711/103 |
| 2010/0313084 A1* | 12/2010 | Hida | .................. | G06F 11/1068 714/704 |
| 2012/0008394 A1* | 1/2012 | Lee | ..................... | G11C 16/0483 365/185.11 |
| 2015/0026391 A1* | 1/2015 | Su | ....................... | G06F 12/0246 711/103 |
| 2016/0118132 A1* | 4/2016 | Prins | ..................... | G11C 16/26 714/704 |

* cited by examiner

*Primary Examiner* — John A Lane
(74) *Attorney, Agent, or Firm* — Neugeboren ODowd PC (57) ABSTRACT

A method and apparatus for refreshing flash memory are disclosed herein. The method includes allocating a different and increasing sequence number to each of a plurality of physical blocks of the flash memory and storing each of the sequence numbers in connection with each of a corresponding one of the physical blocks in non-volatile memory. A refresh-sequence number equal to the highest sequence number in the non-volatile memory is also stored, and in response to a refresh trigger, data in each of the physical blocks that has a sequence number less than the refresh-sequence number is copied to a corresponding one of a plurality of new physical blocks. A new sequence number is then allocated to each of the new physical blocks.

16 Claims, 9 Drawing Sheets

Refresh_sqnum = 9

SMART REFRESH OF DATA ON FLASH DEVICES

CLAIM OF PRIORITY UNDER 35 U.S.C. §119

The present Application for Patent claims priority to Provisional Application No. 62/233,731, filed Sep. 28, 2015, entitled "SMART REFRESH OF FILE SYSTEM DATA ON FLASH DEVICES," and assigned to the assignee hereof and hereby expressly incorporated by reference herein.

BACKGROUND

Field

The present invention relates to computing devices. In particular, but not by way of limitation, the present invention relates to reducing errors and retaining data in flash memory devices.

Background

In general, a flash memory device is one type of memory device that can retain stored digital data—even when no power is being provided to the device. This nonvolatile memory (for nonvolatile data) is available in many forms including NAND memory.

The data on flash memory degrades overtime, which is known as data decay, and this decay is accelerated by extreme temperatures. When data on flash memory is read over and over again, this can also cause decay of data. This is known as read disturb, which can degrade the data in the page/block that is read and the adjacent cells (e.g., including other pages or blocks) as well.

A known method to handle these aspects of decay/degrade/disturb of the data is to refresh the data (e.g., copying the data from one flash block to another block). This refresh occurs periodically—typically every few months. Traditionally these refresh options end up refreshing all the blocks in the device and are not power-down safe. In the event of a power down, the refresh usually reoccurs on the entire file system partition; thus, wearing the memory down.

SUMMARY

According to an aspect, a method is disclosed for refreshing flash memory on a computing device, the method included allocating a different and increasing sequence number to each of a plurality of physical blocks of the flash memory, storing each of the sequence numbers in connection with each of a corresponding one of the physical blocks, and storing a refresh-sequence number equal to the highest sequence number in the non-volatile memory. In response to a refresh trigger, data in each of the physical blocks that has a sequence number less than the refresh-sequence number is copied to a corresponding one of a plurality of new physical blocks, and a new sequence number is allocated to each of the new physical blocks.

According to another aspect, a computing device comprising device includes a flash memory comprising a plurality of physical blocks configured for storing data and a flash interface configured for managing the data on the physical blocks. The flash interface includes a flash manager configured to allocate a different and increasing sequence number to each of a plurality of physical blocks of the flash memory and store each of the sequence numbers in connection with each of a corresponding one of the physical blocks in non-volatile memory. A refresh orchestrator is configured to store a refresh-sequence number equal to the highest sequence number in the non-volatile memory, copy, in response to a refresh trigger, data in each of the physical blocks that has a sequence number less than the refresh-sequence number to a corresponding one of a plurality of new physical blocks, and prompt the flash manager to allocate a new sequence number to each of the new physical blocks.

DETAILED DESCRIPTION

Figure 1:
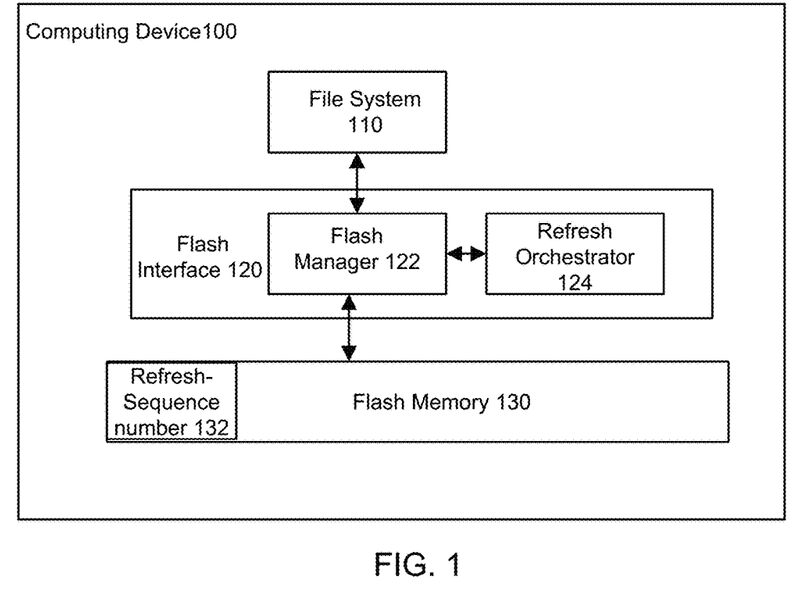
FIG. 1 is a block diagram of a computing device.

Referring first to FIG. 1, shown is a block diagram depicting components of an embodiment of a computing device 100, including a file system 110, flash interface 120, and flash memory 130. As shown, the flash interface 120 includes a flash manager 122, and a refresh orchestrator 124, which addresses the read disturb and data retention issues described above by employing a more selective and intelligent refreshing of data.

As shown, the refresh orchestrator 124 is coupled to the flash manager 122, and the flash manager 122 is coupled to both the file system 110 and flash memory 130. It should be noted that the depicted division of components in FIG. 1 is intended to be a logical division of functional components to help describe various aspects of the embodiments disclosed herein. But one of ordinary skill in the art in view of this disclosure will appreciate that the depicted components may be combined or further divided in actual implementation. For example, the functionality of the refresh orchestrator 124 may be integrated with the flash manager 122 so that the two logically separated components depicted in FIG. 1 may appear to be a single construct when implemented.

It should also be recognized that the file system 110 is simply an example of a construct that may use the flash memory 130. But it is certainly contemplated that other constructs may use flash memory 130, and regardless of the source and type of data stored in flash memory 130, the smart-refresh aspects disclosed herein are applicable. Thus, when the file system 110 is referred to herein, other sources of data may be substituted for the file system 110.

In some embodiments the flash manager 122 may be realized by modifying a software UBI flash management component (known to those of ordinary skill in the art) to interoperate with the refresh orchestrator 124. In other embodiments, the flash manager 122 may be implemented using an embedded multimedia controller (eMMC) that is implemented in firmware. In yet another embodiment, the flash manager 122 may be realized by modifying a universal flash storage (UFS). But it should be recognized that the claims of the present invention are not limited to these specific approaches.

The refresh orchestrator 124 generally operates to manage when and how the flash memory 130 is refreshed. According to an aspect, only the blocks in the partition that are actually used by the file system 110 are refreshed. Also the state of the refresh is stored so the refresh may simply be continued from the state it was at when interrupted on a sudden power down instead of restarting the entire refresh operation.

For example, when a partition of 1000 blocks has only 200 blocks that are actually in use with valid data, only the used 200 blocks are refreshed. Also, if the refresh process is abruptly interrupted by a sudden power down (e.g., after a successful refresh of 199 blocks), only the last remaining block on the next power up is refreshed, and then the refresh orchestrator 124 waits for the refresh cycle period before scrubbing all 200 blocks again.

As one of ordinary skill in the art will appreciate, all the used blocks are tagged by the flash manager 122 with an ever increasing sequence number. This sequence number increases for every block that is used and refreshed or moved. For example, when first allocating blocks physical block 1 may be assigned sequence number 1; physical block 3 may be assigned sequence number 2 ; and if the data is moved from physical block 3 to physical block 2 (as part of the refresh), physical block 2 may get assigned sequence number 3. If physical block 3 is then erased and re-assigned to the file system 110, it gets sequence number 4. If more data is written, and another block is allocated (e.g., block 4), it may be assigned sequence number 5.

According to an aspect, an existence of the sequence number is leveraged to provide a new function. More specifically, after every refresh period of time, a snapshot of the current maximum sequence number may be taken and stored by the refresh orchestrator 124 as a refresh-sequence number 132 in non-volatile memory. And then the refreshing of all the physical blocks may begin with blocks that are older than the refresh-sequence number 132. It should be noted that the refresh-sequence-number 132 may be stored either on the flash memory 130 (as shown in FIG. 1) or on a separate non-volatile memory (not shown). As part of this refresh, any block that is moved gets a new sequence number (that continues to increase).

If the refresh is interrupted before completion, on the next power up, the refresh orchestrator 124 accesses the flash manager 122 to check if a refresh period has completed. If so, the refresh process is restarted by taking a new snapshot of the maximum sequence number and storing it as the refresh-sequence number 132. But if the refresh period has not passed, the previously interrupted refresh process may be continued, and only the remaining blocks that have a sequence number that is still less than the refresh-sequence number 132 are refreshed. Some advantages of this approach are: 1) the refresh process is less susceptible to abrupt power downs because the refresh process may continue from where it left off before the power down; and 2) a smart scrubbing of only the blocks that need to be refreshed is performed instead of all the blocks; thus reducing wear on the flash memory 130.

Figure 2:
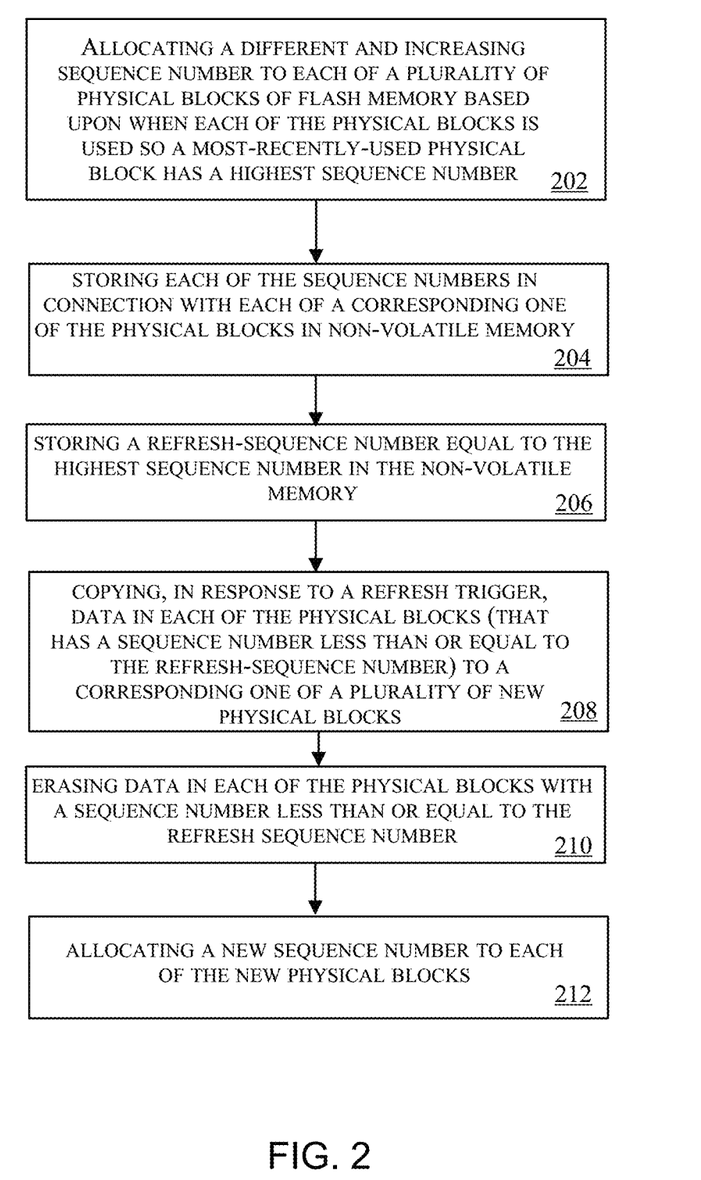
FIG. 2 is a flowchart depicting a method that may be traversed in connection with embodiments disclosed herein.

Referring to FIG. 2, shown is a flow chart representing a method that can be traversed to refresh the flash memory 130. The method starts with allocating a different and increasing sequence number to each of a plurality of physical blocks of flash memory 130 based upon when each of the physical blocks is used so a most-recently-used physical block has a highest sequence number (Block 202). Then each of the sequence numbers in connection with each of the corresponding one of the physical blocks is stored in non-volatile memory (Block 204). Next, a refresh-sequence number equal to the highest sequence number is stored in the non-volatile memory (Block 206). Then the data in each of the physical blocks (that has a sequence number less than or equal to the refresh-sequence number 132) is copied to a corresponding one of a plurality of new physical blocks in response to a refresh trigger (Block 208). Afterwards, the data in each of the physical blocks with a sequence number less than or equal to the refresh-sequence number is erased (Block 210). As shown, a new sequence number is allocated to each of the new physical blocks (Block 212). This method then repeats for each refresh cycle.

Figure 3:
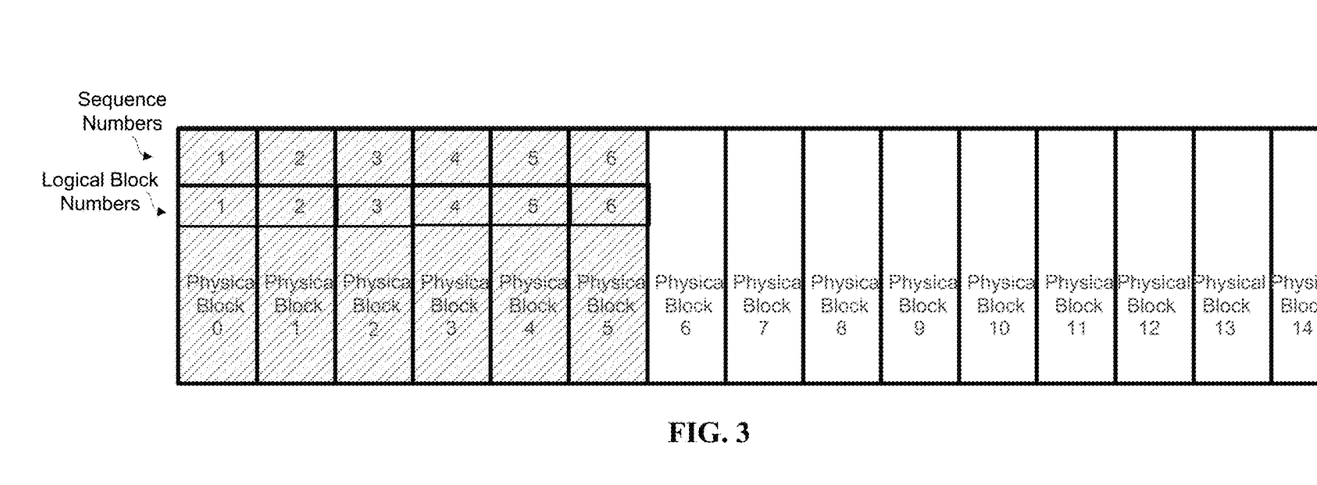
FIG. 3 is a drawing depicting a basic flash memory configuration.

Referring to FIG. 3, shown is a representation of the flash memory 130 depicted in FIG. 1. The flash memory 130 contains multiple physical blocks (also referred to as physical erase blocks (PEBs)). An ever-increasing sequence number is assigned to any used PEB. When a PEB is used or assigned to the file system 110, it is allocated a sequence number that is saved to the flash memory 130 on the PEB.

In FIG. 3, all allocated/used physical blocks are indicated with a pattern and the unused physical blocks do not include any pattern. Each of the used physical blocks is allocated a sequence number in the order of allocation or use, is stored as part of the metadata of that PEB, and is nonvolatile. In this example, PEB 0 is assigned sequence number 1; PEB 1 is assigned sequence number 2; PEB 2 is assigned sequence number 3, etc.

Figure 4A:
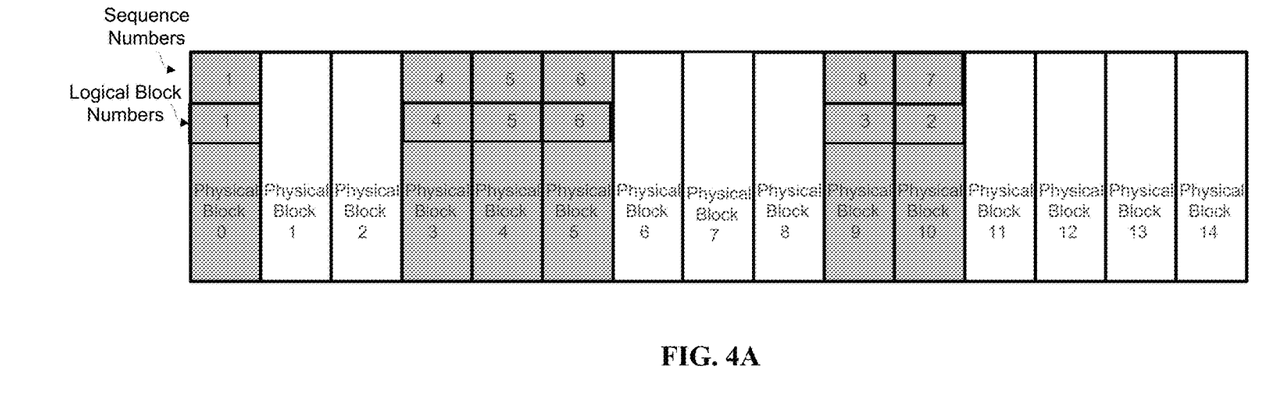
FIG. 4A is a drawing depicting a possible logical block orientation for flash memory in connection with embodiments disclosed herein.
Figure 4B:
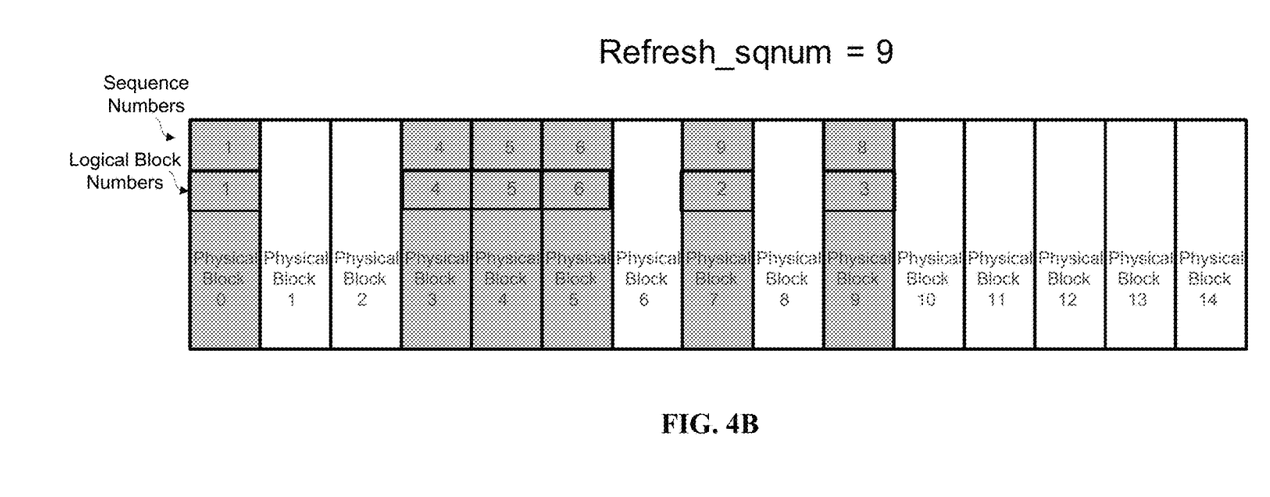
FIG. 4B is a drawing depicting another possible logical block orientation for flash memory in connection with embodiments disclosed herein.

Referring to FIGS. 4A and 4B, several logical blocks have been assigned to identify specific data stored on each of the PEBs. After some file system activity, the used PEBs and unused (erased or stale data) PEBs are interleaved. In FIG. 4A, PEBs 1 and 2 are no longer used and PEBs 10 and 9 are assigned logical block numbers 2 and 3, respectively. Further, logical block numbers 2 and 3 have been assigned new sequence numbers as well. It should be noted at this point that the logical block numbers do not have to be associated with the physical block numbers in any specific numeric ordered way, and perhaps any two of PEBs 6-14 could be assigned logical block numbers 2 and 3 depending on the system availability.

In FIG. 4B, logical block number 2 has further been assigned to PEB 7, and assigned a new sequence number of 9. At this point it should be noted that there can be alterations and skips to the sequence numbers as well as further modifications to the logical block numbering on the available PEBs. This illustrates that the data stored on each of the physical blocks may be moved and its refresh order may also be changed. Further, these modifications may be a result of the commands from a flash interface such as the flash interface 120.

Figure 5:
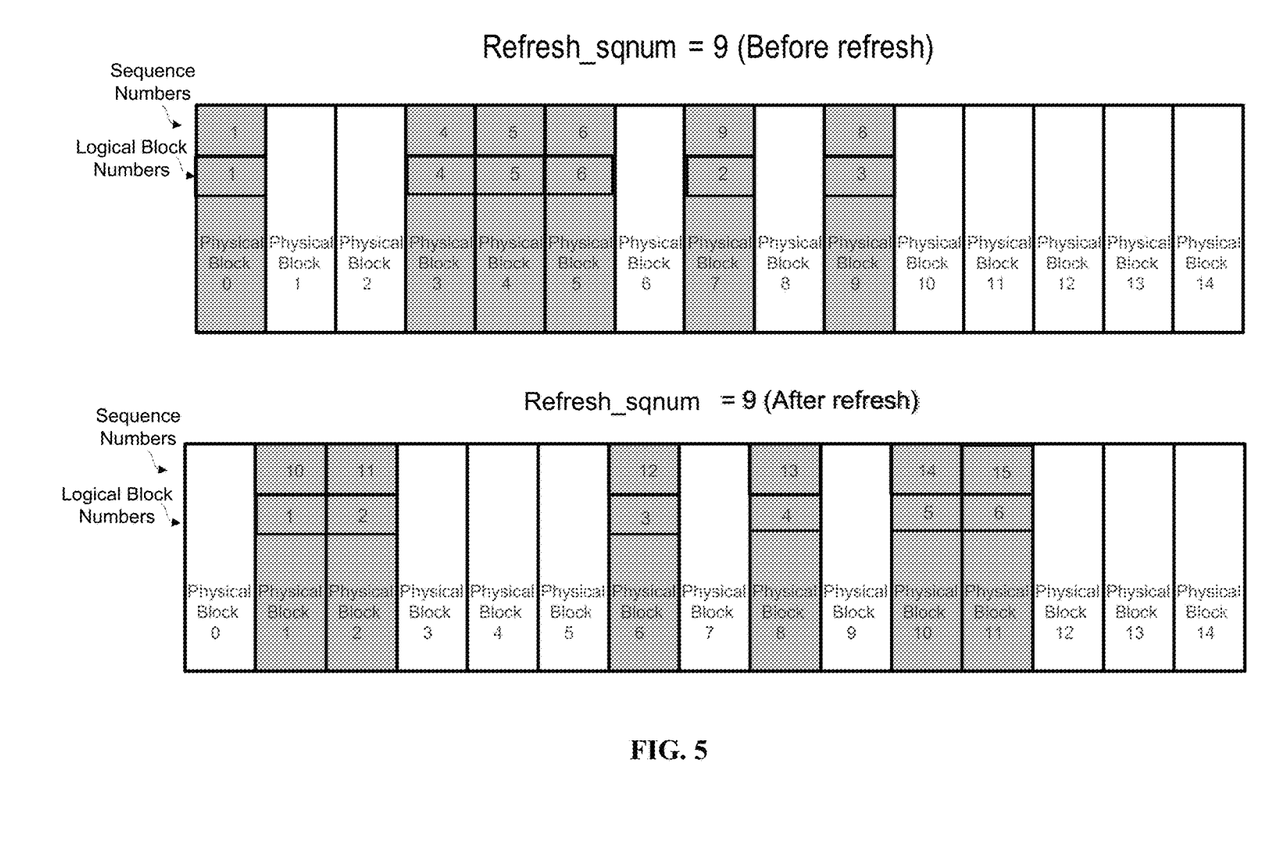
FIG. 5 is a drawing depicting a possible refresh sequence for flash memory in connection with embodiments disclosed herein.

On every boot up, the used blocks may be scanned and the sequence number that is on disk may be stored to memory for each of the PEBs. When a block is moved or updated, the new sequence number is updated both in RAM and on the persistent, nonvolatile metadata of the PEB. When the refresh period expires, then the current maximum sequence number is saved as the refresh sequence number 132 to a file or other persistent, nonvolatile store. As shown in FIG. 5, if the refresh period were to expire, the refresh-sequence number 132 is set to 9.

Figure 6:
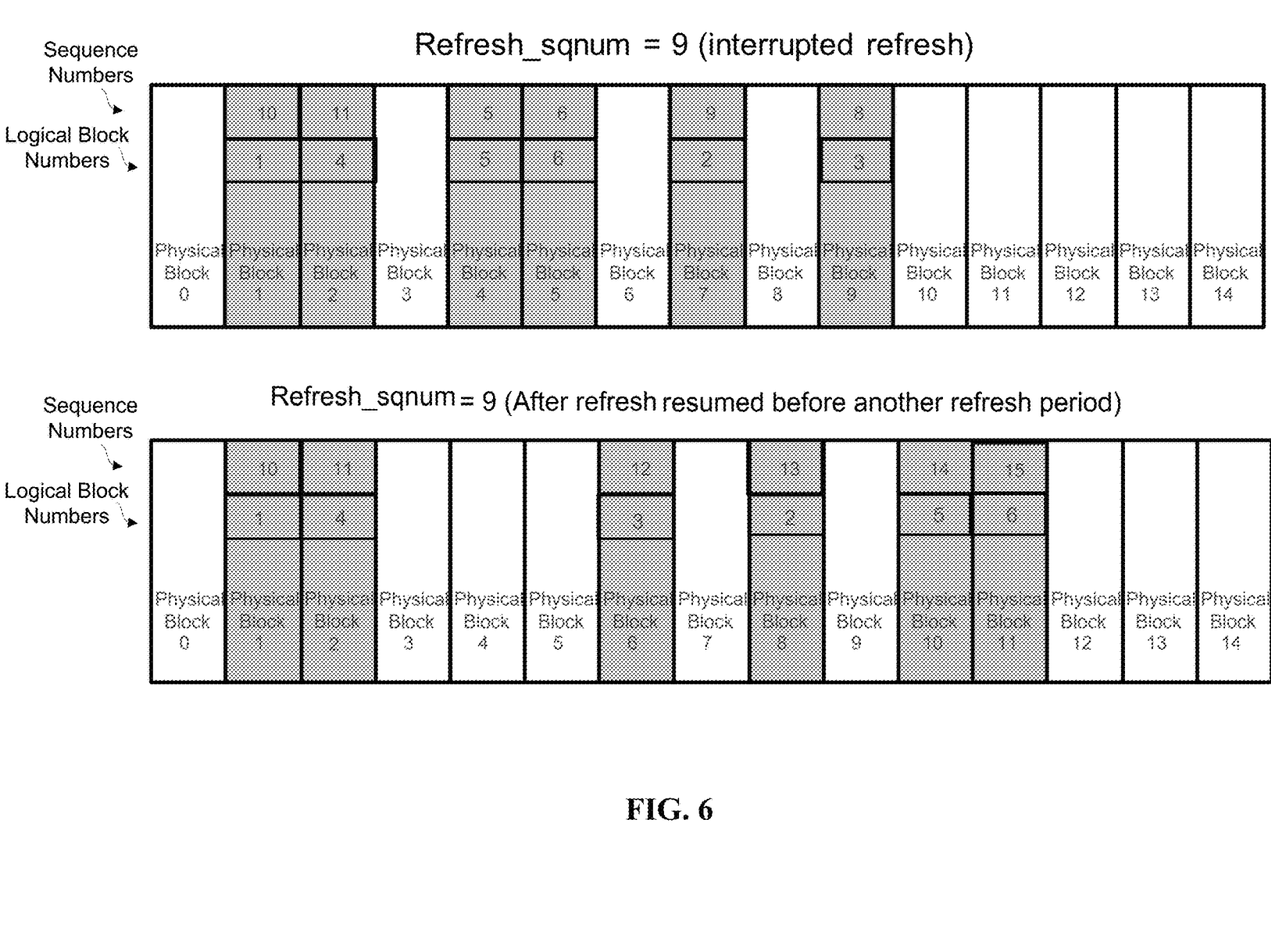
FIG. 6 is a drawing depicting a possible short term interrupted refresh sequence for flash memory in connection with embodiments disclosed herein.

Continuing with the present example, as shown in FIG. 6, the refresh is triggered with a refresh-sequence number 132 of 9, and any data in a block that has a sequence number that is less than or equal to the refresh-sequence number 132 is refreshed (e.g., it is copied to a new location and assigned a new sequence number). The data on the previous physical blocks is then erased to prevent duplicates of data being created. After the refresh, none of the used blocks have a sequence number that is less than or equal to the refresh-sequence number 132 that was last stored.

In case the refresh is interrupted by an abrupt power down, and the state that the refresh was completed cannot be saved, if a reboot is carried out before another refresh period, the refresh may simply be retriggered with the same refresh-sequence number 132 as shown in FIG. 6.

Figure 7:
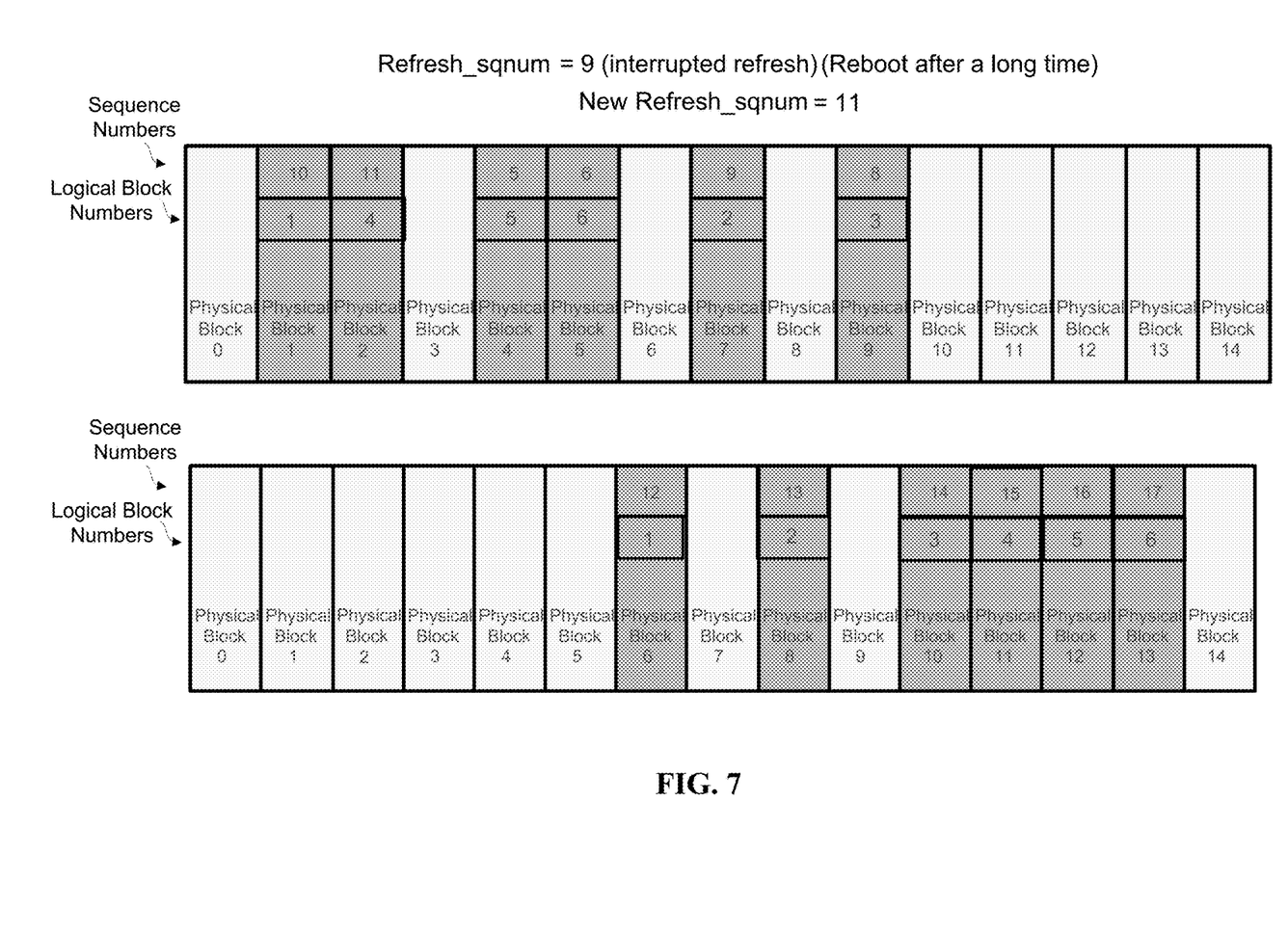
FIG. 7 is a drawing depicting a possible long term interrupted refresh sequence for flash memory in connection with embodiments disclosed herein.

Referring to FIG. 7, after an interrupted refresh, if the next boot up is a long time later and another refresh period has passed, a new refresh-sequence number 132 is snapshotted. In the example depicted in FIG. 7, the new refresh-sequence number is 11, and a new full refresh is initiated.

Figure 8:
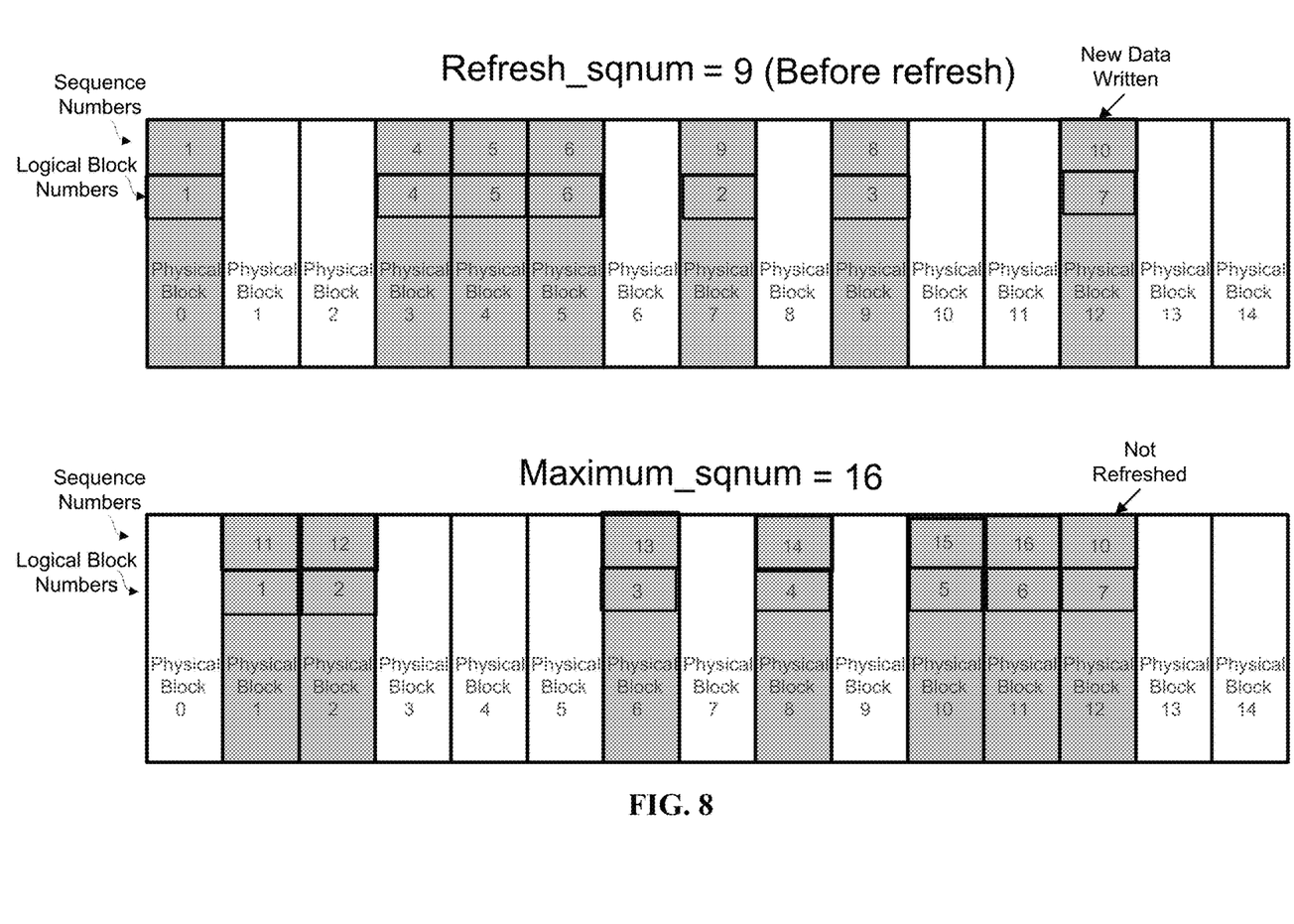
FIG. 8 is a drawing depicting a possible refresh sequence with new data written for flash memory in connection with embodiments disclosed herein.

Referring to FIG. 8, shown is a refresh sequence where new data has been written to the flash memory 130. In this case logical blocks 1-6, which were pre-existing and have a sequence number lower than or equal to the refresh-sequence number 132 of 9, are refreshed as described previously in FIG. 5 except for now sequence number 10 is assigned to the newly written data. The newly written data is assigned a new logical block number 7, is written into a previously empty physical block 12, and is assigned a sequence number of 10. Because the sequence number 10 is greater than the refresh-sequence number of 9, the newly written data does not get refreshed for the first refresh cycle after it has been written. At the beginning of the next refresh period (e.g., a time period) the refresh-sequence number 132 becomes 16 (the maximum sequence number in this example), corresponding to the new highest sequence number assigned to logical block 6. Because of this, the newly written data will be refreshed for the refresh cycle where the refresh-sequence number is 16.

Additionally, it is contemplated that new data can be written directly after an interrupt in a refresh, and before the next refresh cycle. In the case where the interrupt occurs before another refresh period, similar to the case of FIG. 6, the newly written data is assigned a sequence number greater than the highest sequence number of the previously written logical blocks, such that it will not be refreshed in the next immediate refresh but may be incorporated into all of the following refreshes afterwards. This process is carried out quite similarly to the process described in FIG. 6, except for the fact that the newly written data may be assigned logical block 7 on any of the unassigned physical blocks, and given a refresh sequence of 10 or greater.

Further, in the case where the interrupt lasts longer than a refresh period, similar to the case of FIG. 7, the newly written data is assigned a sequence number greater than the highest sequence number of the blocks that were refreshed before the interrupt. For example, if logical blocks 1 and 4 were refreshed before the interrupt, and assigned new highest sequence numbers of 10 and 11, the new refresh-sequence number would thus be 11. So, in order for the newly written data to not be refreshed immediately, it would then be assigned a sequence number of 12. In this way, when the refresh is restarted, the newly written data remains unchanged, but may then be incorporated into all of the following refreshes.

If an interrupt occurs after the copying of a logical block, but before the erasing of the old corresponding logical block, the flash interface 120 can recognize that there is a duplicate of data and erase the duplicate logical block with the lower sequence number, which is the one that hadn't been erased due to the interrupt.

Figure 9:
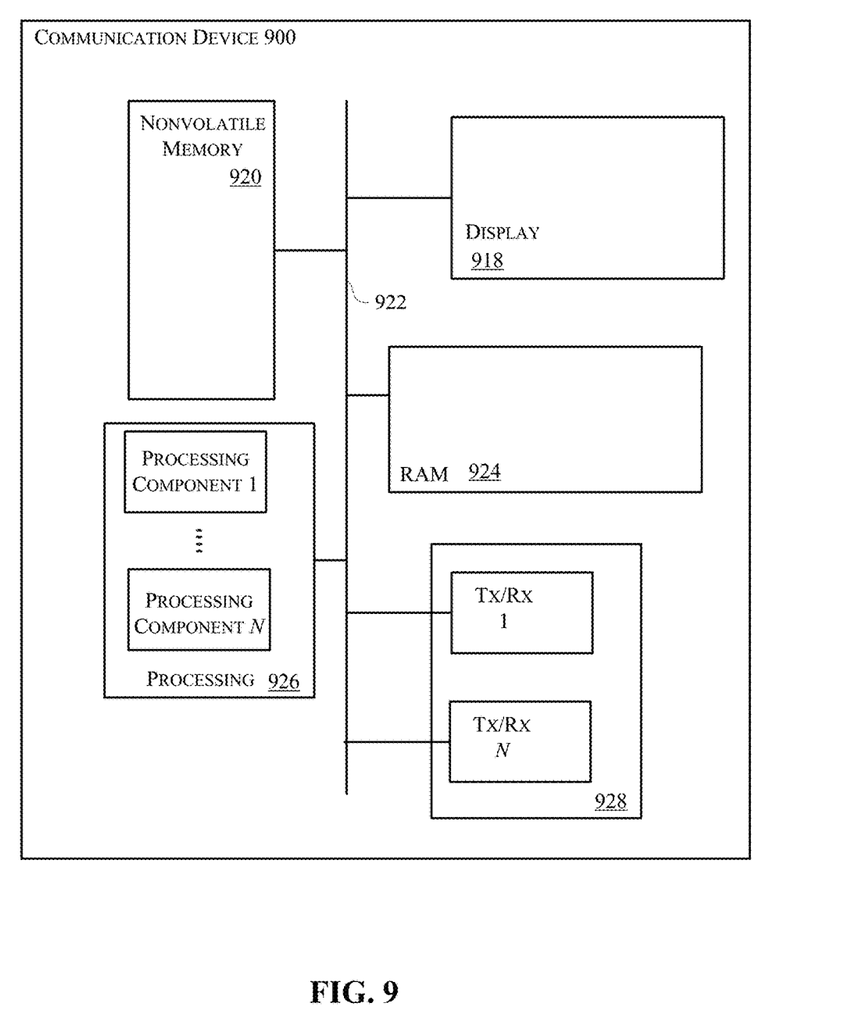
FIG. 9 is a drawing depicting components that may be used to realize the computing device depicted in FIG. 1.

Referring next to FIG. 9, shown is a block diagram depicting physical components of an exemplary computing device 900 that may be utilized to realize the computing device 100 described with reference to FIG. 1. As shown, the computing device 900 in this embodiment includes a display 918, and nonvolatile memory 920 that are coupled to a bus 922 that is also coupled to random access memory ("RAM") 924, N processing components 926, and a transceiver component 928 that includes N transceivers.

Although the components depicted in FIG. 9 represent physical components, FIG. 9 is not intended to be a hardware diagram; thus many of the components depicted in FIG. 9 may be realized by common constructs or distributed among additional physical components. Moreover, it is certainly contemplated that other existing and yet-to-be developed physical components and architectures may be utilized to implement the functional components described with reference to FIG. 9.

The display 918 generally operates to provide a presentation of content to a user, and may be realized by any of a variety of displays (e.g., CRT, LCD, HDMI, micro-projector and OLED displays).

And in general, the nonvolatile memory 920 functions to store (e.g., persistently store) data and executable code including code that is associated with the functional components depicted in FIG. 1. In some embodiments for example, the nonvolatile memory 920 includes bootloader code, modem software, operating system code, file system code, and code to facilitate the implementation of one or more portions of the computing device 100 discussed in connection with FIG. 1 as well as other components well known to those of ordinary skill in the art that are not depicted nor described in connection with FIG. 1 for simplicity. For example, code to implement the flash interface 120 and the refresh sequence number may be stored in the nonvolatile memory 920, and the nonvolatile memory 920 may be used to realize the flash memory 130.

As discussed above, the nonvolatile memory 920 is realized by flash memory (e.g., NAND memory). Although it may be possible to execute the code from the nonvolatile memory 920, the executable code in the nonvolatile memory 920 is typically loaded into RAM 924 and executed by one or more of the N processing components 926.

The N processing components 926 in connection with RAM 924 generally operate to execute the instructions stored in nonvolatile memory 920 to effectuate the functional components depicted in FIG. 1 such as the flash interface 120 (including the flash manager 122 and the refresh orchestrator 124). As one of ordinarily skill in the art will appreciate, the N processing components 926 may include an application processor, a video processor, modem processor, DSP, graphics processing unit (GPU), and other processing components.

The transceiver component 928 includes N transceiver chains, and each of the N transceiver chains may represent a transceiver associated with a particular communication scheme. For example, each transceiver may correspond to protocols that are specific to local area networks, cellular networks (e.g., a CDMA network, a GPRS network, a UMTS networks), and other types of communication networks.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, or computer software in connection with hardware.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method for refreshing flash memory on a computing device, the method comprising:
   allocating a different and increasing sequence number to each of a plurality of physical blocks of the flash memory;
   storing each of the sequence numbers in connection with each of a corresponding one of the physical blocks;
   storing a refresh-sequence number equal to the highest sequence number in non-volatile memory;
   copying, in response to a refresh trigger, data in each of the physical blocks that has a sequence number less than the refresh-sequence number to a corresponding one of a plurality of new physical blocks; and
   allocating a new sequence number to each of the new physical blocks.

2. The method of claim 1, the method including:
   erasing data in each of the physical blocks with a sequence number less than or equal to the refresh-sequence number.

3. The method of claim 2, wherein if there is an interrupt in the copying and erasing that occurs before a next refresh trigger, then resuming the copying and erasing with the same refresh-sequence number.

4. The method of claim 2, wherein if there is an interrupt in the copying and erasing that occurs after a next refresh trigger, then:
   storing a new refresh-sequence number equal to the highest sequence number in the non-volatile memory;
   restarting the copying and erasing; and
   allocating a new sequence number to each of the new physical blocks.

5. The method of claim 2, wherein if there is new data written to a physical block of the flash memory, the new data is given a new sequence number greater than the highest current sequence number so the new data is not refreshed during the next refresh trigger.

6. The method of claim 1, wherein allocating a different and increasing sequence number is based upon when each of the physical blocks is used so a most-recently-used physical block has a highest sequence number.

7. A computing device comprising:
   a flash memory comprising a plurality of physical blocks configured for storing data; and
   a flash interface configured for managing the data on the physical blocks, the flash interface including:
      a flash manager configured to:
         allocate a different and increasing sequence number to each of a plurality of physical blocks of the flash memory; and
         store each of the sequence numbers in connection with each of a corresponding one of the physical blocks in non-volatile memory;
      a refresh orchestrator configured to:
         store a refresh-sequence number equal to the highest sequence number in the non-volatile memory;
         copy, in response to a refresh trigger, data in each of the physical blocks that has a sequence number less than the refresh-sequence number to a corresponding one of a plurality of new physical blocks; and
         prompt the flash manager to allocate a new sequence number to each of the new physical blocks.

8. The computing device of claim 7, including:
   a file system to utilize the flash memory, wherein the data stored in the physical blocks include file system data.

9. The computing device of claim 7, wherein the non-volatile memory for storing the refresh-sequence number is the flash memory.

10. The computing device of claim 7, wherein the non-volatile memory for storing the refresh-sequence number is non-volatile memory that is separate from the flash memory.

11. A non-transitory, tangible processor readable storage medium, encoded with processor readable instructions to perform a method for refreshing flash memory on a computing device, the method comprising:
- allocating a different and increasing sequence number to each of a plurality of physical blocks of the flash memory;
- storing each of the sequence numbers in connection with each of a corresponding one of the physical blocks in non-volatile memory;
- storing a refresh-sequence number equal to the highest sequence number in the non-volatile memory;
- copying, in response to a refresh trigger, data in each of the physical blocks that has a sequence number less than the refresh-sequence number to a corresponding one of a plurality of new physical blocks; and
- allocating a new sequence number to each of the new physical blocks.

12. The non-transitory, tangible computer readable storage medium of claim 11, the method including:
- erasing data in each of the physical blocks with a sequence number less than or equal to the refresh-sequence number.

13. The non-transitory, tangible computer readable storage medium of claim 12, wherein if there is an interrupt in the copying and erasing that occurs before a next refresh trigger, then resuming the copying and erasing with the same refresh-sequence number.

14. The non-transitory, tangible computer readable storage medium of claim 12, wherein if there is an interrupt in the copying and erasing that occurs after a next refresh trigger, then:
- storing a new refresh-sequence number equal to the highest sequence number in the non-volatile memory;
- restarting the copying and erasing; and
- allocating a new sequence number to each of the new physical blocks.

15. The non-transitory, tangible computer readable storage medium of claim 12, wherein if there is new data written to a physical block of the flash memory, the new data is given a new sequence number greater than the highest current sequence number so the new data is not refreshed during the next refresh trigger.

16. The non-transitory, tangible computer readable storage medium of claim 12, wherein allocating a different and increasing sequence number is based upon when each of the physical blocks is used so a most-recently-used physical block has a highest sequence number.

* * * * *